United States Patent
Yamamoto

[19]

[11] Patent Number: 6,130,571
[45] Date of Patent: Oct. 10, 2000

[54] SEMICONDUCTOR DEVICE WITH FINE-ADJUSTABLE RESISTANCE

[75] Inventor: Isao Yamamoto, Kyoto, Japan

[73] Assignee: Rohm Co., Ltd., Kyoto, Japan

[21] Appl. No.: 09/188,855

[22] Filed: Nov. 9, 1998

[30] Foreign Application Priority Data

Jan. 10, 1998 [JP] Japan ................................ 10-015056

[51] Int. Cl.[7] ................................................. H01H 37/76
[52] U.S. Cl. ......................................... 327/525; 327/403
[58] Field of Search .................................. 327/525, 526, 327/403, 404; 365/225.7, 96

[56] References Cited

U.S. PATENT DOCUMENTS

| | | | |
|---|---|---|---|
| 4,446,534 | 5/1984 | Smith | 365/96 |
| 4,673,866 | 6/1987 | Masuda | 323/313 |
| 4,686,384 | 8/1987 | Harvey et al. | 327/530 |
| 5,459,684 | 10/1995 | Nakamura et al. | 365/149 |
| 5,471,427 | 11/1995 | Murakami et al. | 365/200 |
| 5,838,076 | 11/1998 | Zarrabian et al. | 307/115 |

*Primary Examiner*—Terry D. Cunningham
*Assistant Examiner*—Hai L. Nguyen
*Attorney, Agent, or Firm*—Majestic, Parsons, Siebert & Hsue P.C.

[57] ABSTRACT

A semiconductor device includes a plurality of resistors connected in series, each resistor associated with a fuse and a switching device such that the fuse can be selectively connected in parallel with it or to a line through which a current can be supplied to the fuse so as to break it. After the resistance of the device is measured and is found to require a fine adjustment by breaking a selected one or more of the fuses, this selection is communicated from outside in an encoded signal. A decoder serves to decode this encoded signal and causes a fusing current to break the selected fuse (or fuses). Thus, only a reduced number of pads are required to access the fuses from outside. A source of the fusing current may be also contained as a part of the semiconductor device and serve to attenuate a surge current, which may invade from outside, before it reaches the fuse. The decoder may further serve to control the fusing current, or its source, such that no current is allowed to pass through except when it is intended to break a specified fuse or fuses.

18 Claims, 5 Drawing Sheets

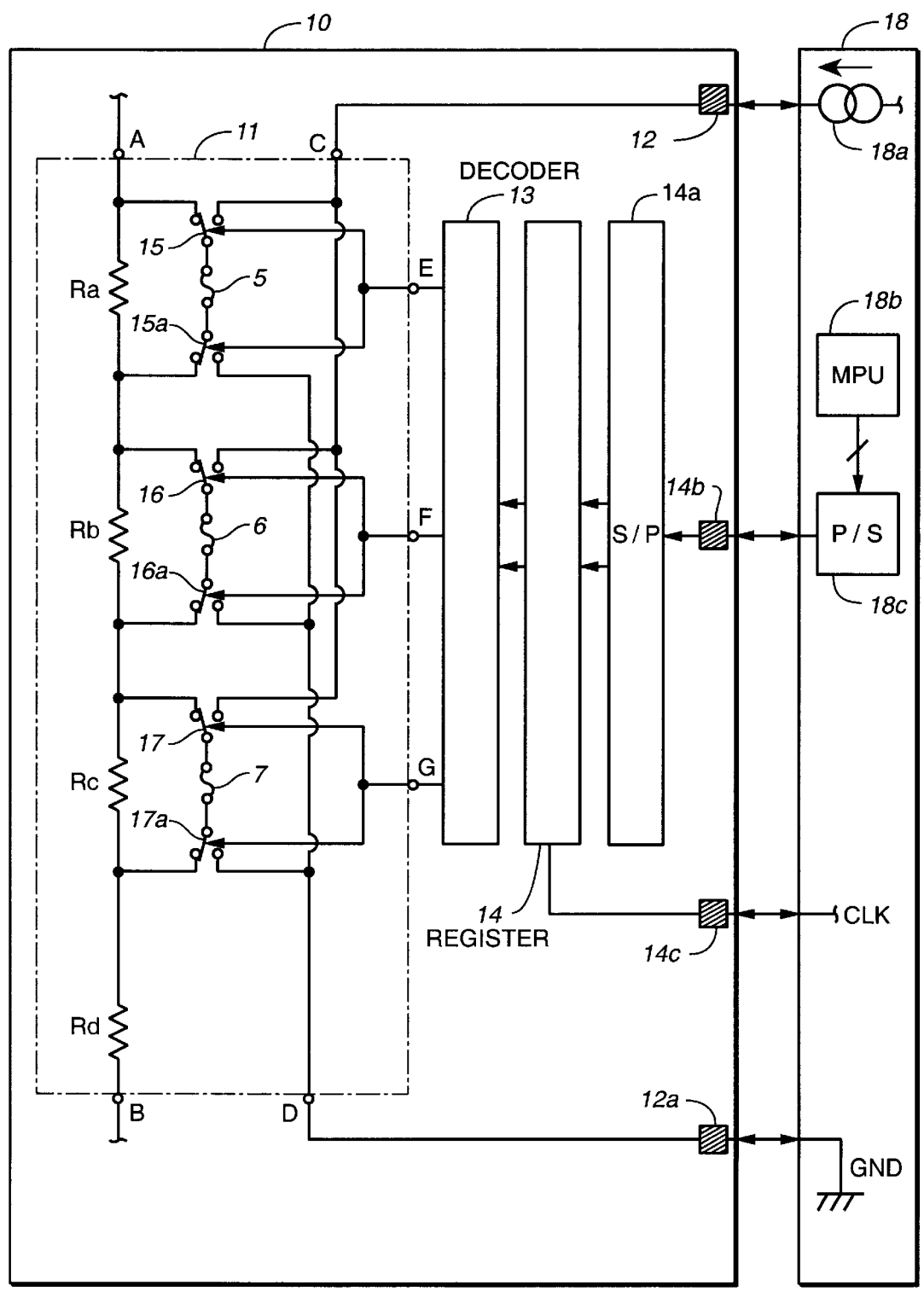
FIG._1

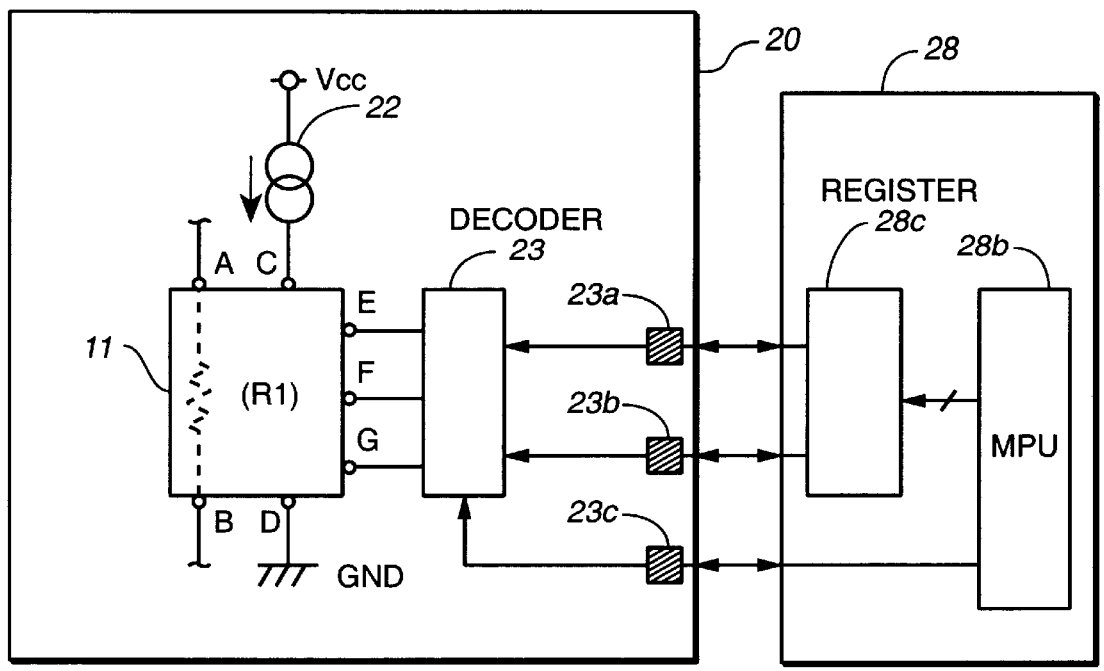
FIG._2
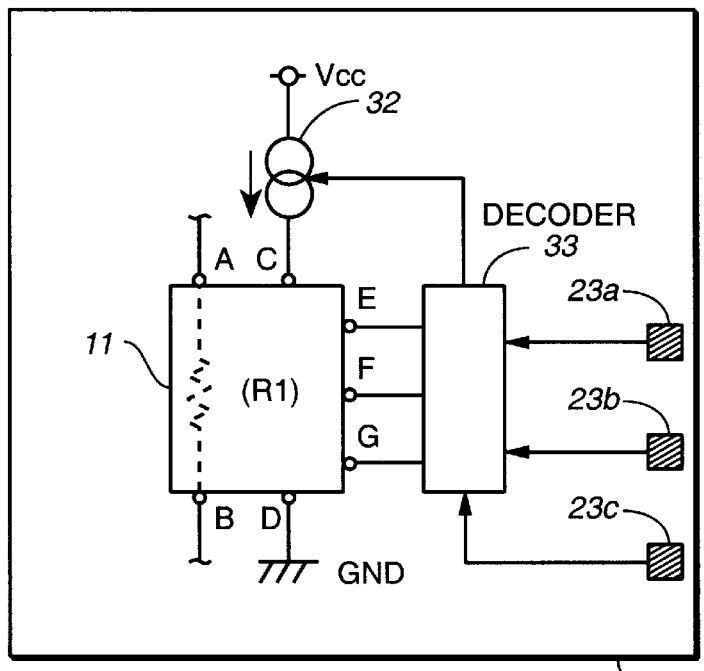
FIG._3

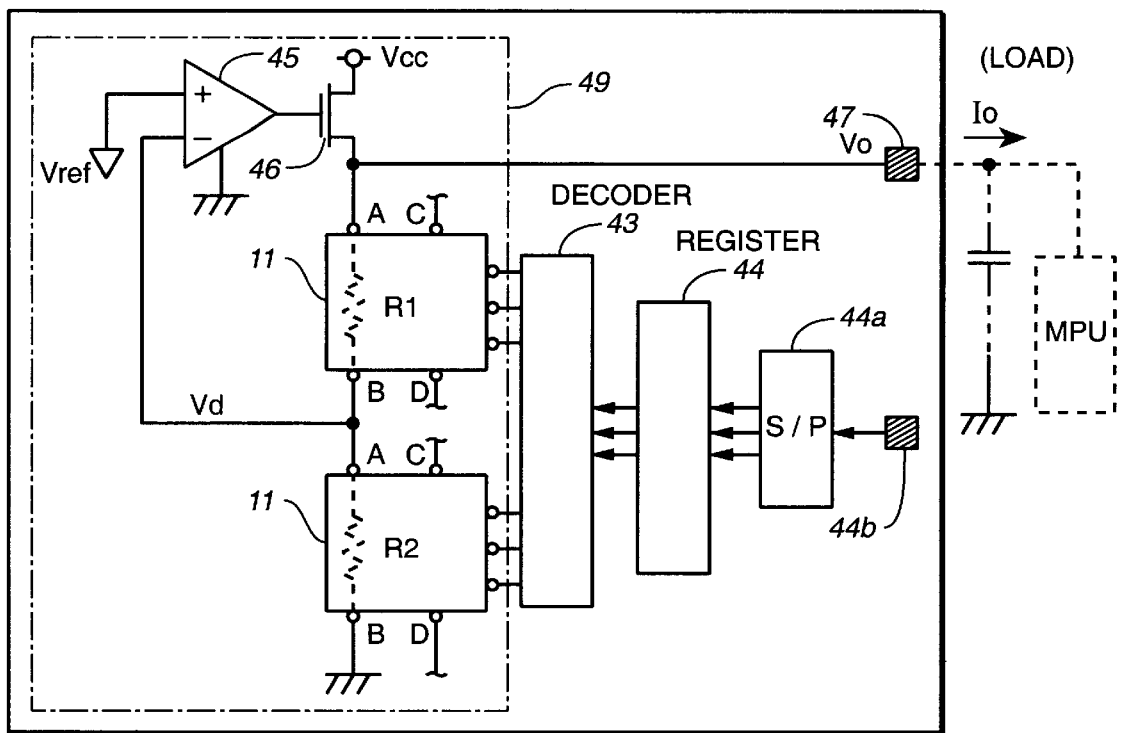
FIG._4
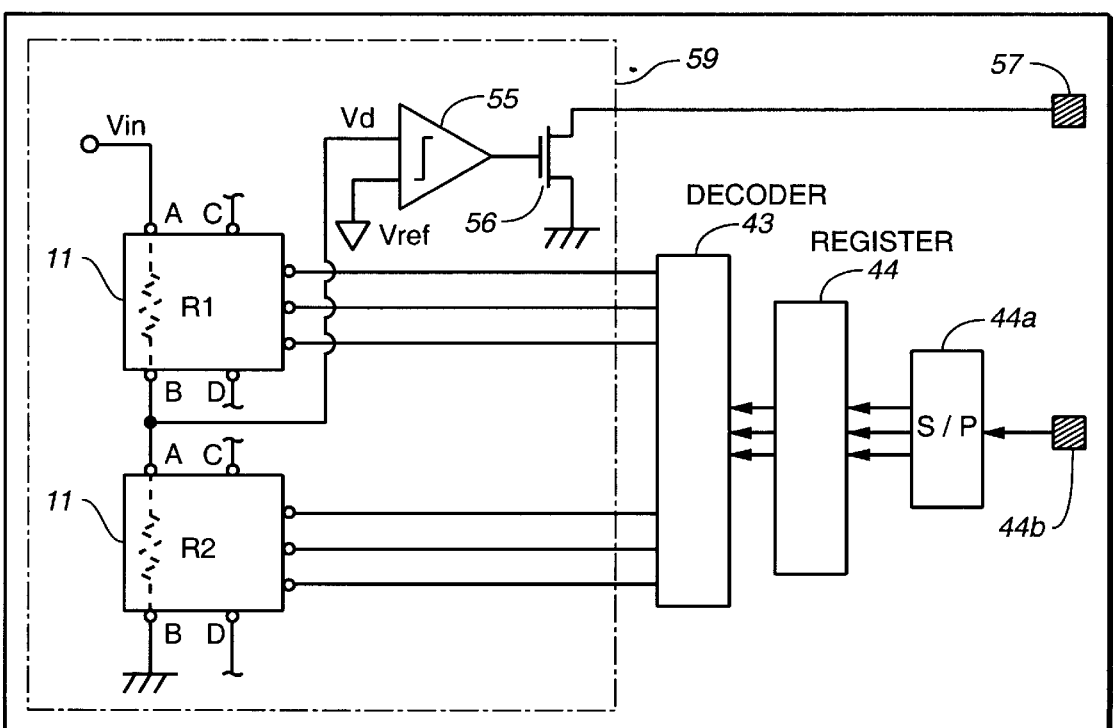
FIG._5

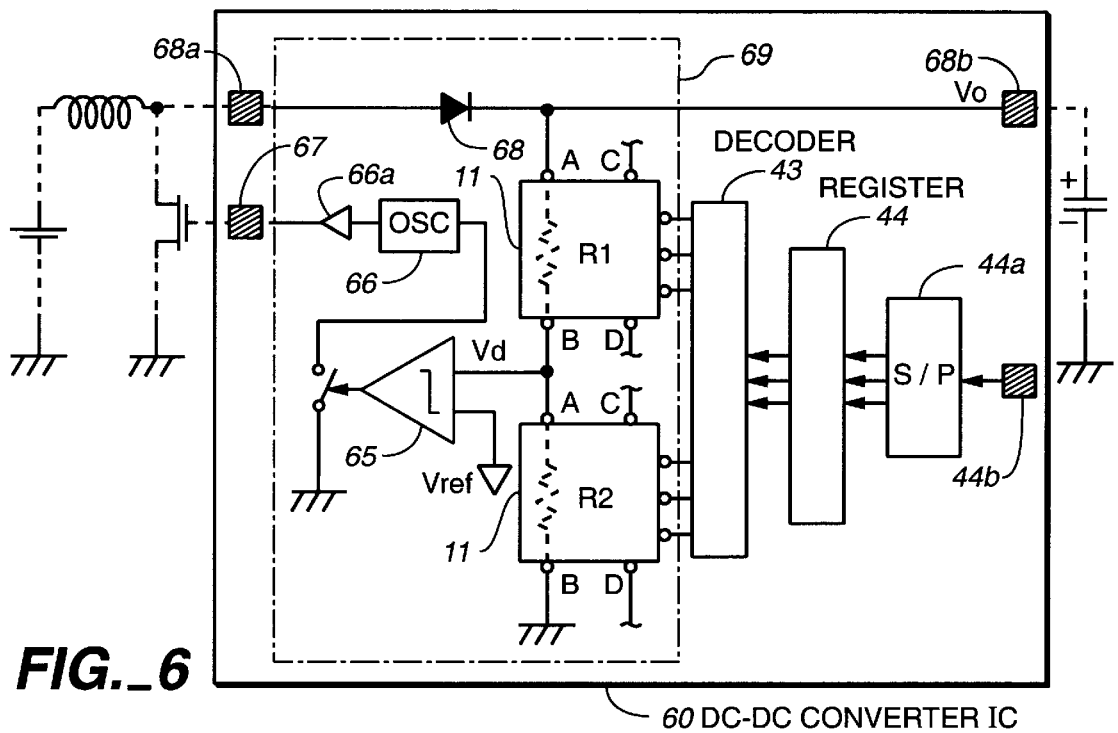
FIG._6
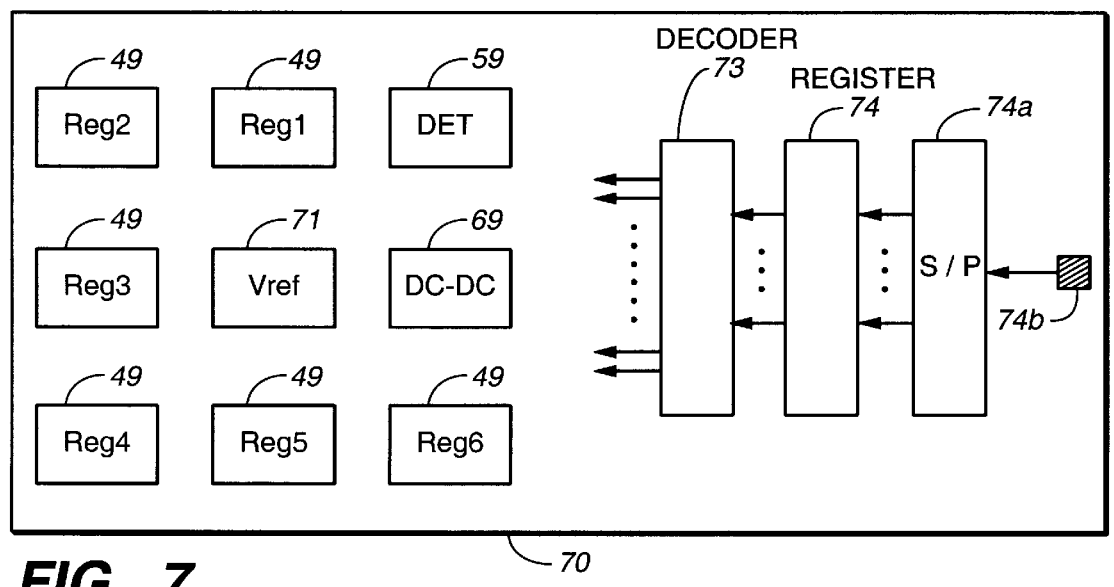
FIG._7

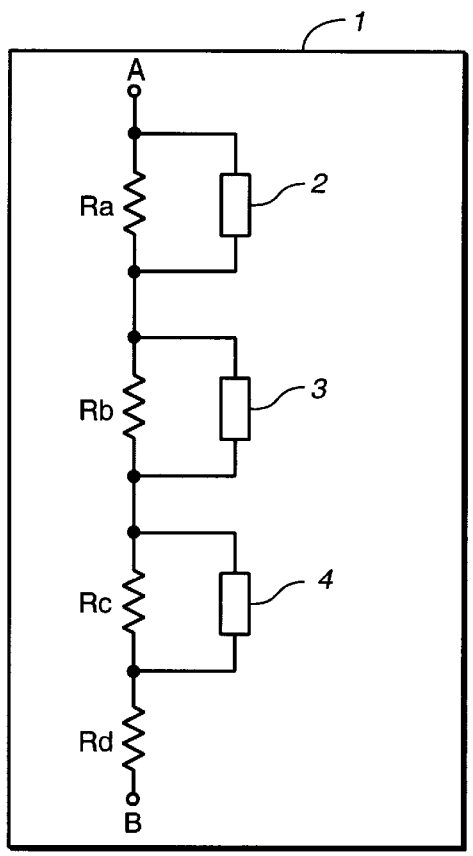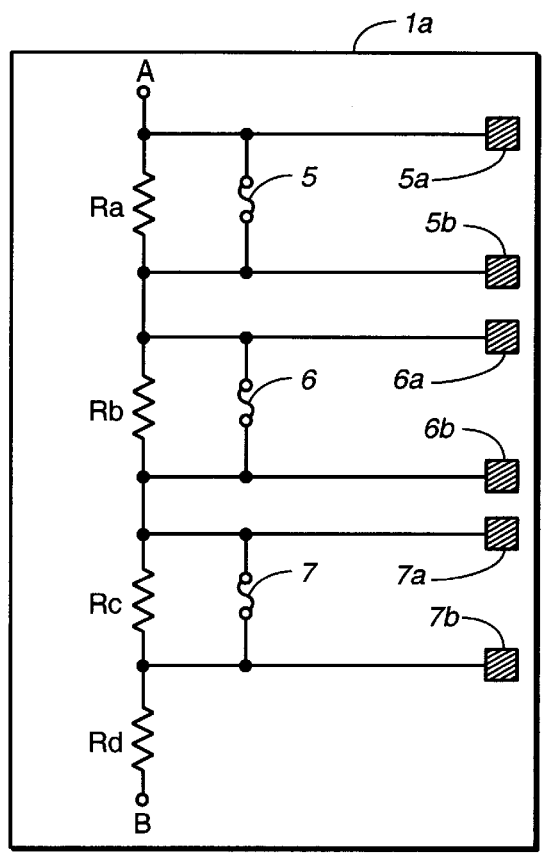
FIG._8
(PRIOR ART)
FIG._9
(PRIOR ART)

SEMICONDUCTOR DEVICE WITH FINE-ADJUSTABLE RESISTANCE

BACKGROUND OF THE INVENTION

This invention relates to a semiconductor device containing a network of resistors such that its resistance can be fine-adjusted and more particularly to such a semiconductor device comprising an improved trimming means for carrying out a fine adjustment of its resistance.

For providing an integrated circuit (IC), or a semiconductor device containing a resistor of which the resistance can be fine-adjustable so as to have a desired value, it has been known (as disclosed, for example, in Japanese Patent Publications Tokkai 5-235282 and 8-335674) to make use of a resistor network comprising a plurality of resistor units and a trimming means such that a fine adjustment, or a trimming process, can be carried out after its resistance is measured.

FIG. 8 shows an example of such a prior art IC 1 including a resistor network formed by connecting four resistor units Ra, Rb, Rc and Rd in series and trimming units 2, 3 and 4 connected in parallel respectively with resistor units Ra, Rb and Rc. Resistor unit Rd is designed to have a resistance close to a target resistance value, while resistor units Ra, Rb and Rc are designed to have small resistance values corresponding to the variations from the target resistance. The trimming units 2, 3 and 4 are each capable of being selectively in either a short-circuit (or closed) condition or a released (or open) condition and also of changing its condition at least once. At the time of a probe test after a wafer processing, the resistance between terminals A and B is normally measured and, if this measured resistance is within a specified allowable range, this wafer or a bare chip is directly sent to a next process. If the measured resistance is not within the allowable range, one or more of the trimming units 2, 3 and 4 are selected and their conditions are changed, depending on how far the measured value is off the allowable range. Thus, a trimming can be carried out so as to bring the final resistance value within a range between the resistance of resistor unit Rd and that obtained by adding thereto the resistance values of the other resistor units Ra, Rb and Rc. Those of wafers and bare chips, on which a trimming and other tests have been carried out, are directed to a later process and ICs are assembled through wire bonding and packaging steps. After ICs are thus completed, the trimming units 2, 3 and 4 become hidden inside the ICs, screened off from outside.

At the time of measuring the resistance, however, one cannot ignore the contact resistance between the probe pin and the pad because this contact resistance varies sensitively and unstably in a wide range of about 1Ω to 10Ω, depending on the extent of oxidation, for example, on the contact surfaces of the tungsten probe pin and the aluminum pad which tend to form a layer of oxide on the surface as well as the scratches on the pad surface sustained by the tip of the probe pin. As a result, the adjustment of resistance is not complete by a trimming process alone based on a probe test, and many IC products fail to pass the final test and are discarded.

On the other hand, there is an increased demand for accurate electronic components, and a trimming process is frequently required to be carried out even on resistors contained inside an IC. As the level of integration is improved and ICs come to have many pins, the number of pins on probe cards is also increased and the probe pins become thinner. Thus, the contact resistance cannot be expected to become stable, and the unstable contact resistance means a lower yield of products.

In order to make it possible to fine-adjust the resistance of an IC even after it has been assembled, one might consider an IC shown in FIG. 9 at 1a, having fuses 5, 6 and 7 instead of the trimming units 2, 3 and 4 and pairs of pads 5a and 5b, 6a and 6b, and 7a and 7b each connected to both ends of the associated one of the trimming units 5, 6 and 7, as shown. A fine adjustment of such an IC is possible by supplying a fusing current from an external source to cut an appropriate fuse (or fuses) through an IC pin (not shown) connected to each of the pads. With an IC thus structured, however, the fuses for fine-adjustments remain connected to the pins even after the IC is completed and hence external effects on the pin can directly influence the fuses. Thus, its resistance may unexpectedly change due to a damage to the fuse caused electrostatically, such as by an external surge current. Moreover, since two pads or one pad and a pin are required for each fuse, there are a large total number of pads and pins which are used only for the adjustment of the resistance.

Such an increase in the numbers of pads and pins is not desirable especially where a high degree of integration is required.

SUMMARY OF THE INVENTION

It is therefore an object of this invention to overcome such problems by providing an improved semiconductor device of which the fuses for fine adjustment of its resistance are not easily damaged.

It is another object of this invention to provide a semiconductor device requiring a smaller number of pads for fine-adjustment of resistance than prior art semiconductor devices.

A semiconductor device embodying this invention, with which the above and other objects can be accomplished, may be characterized in most basic terms as comprising a resistor and a trimming means for carrying out a fine adjustment of its resistance value, including a fuse and switching means for selectively connecting the fuse in parallel with this resistor or to a line through which a current is adapted to be supplied to the fuse so as to break it. With such a structure, the fine adjustment of the resistance value is possible even after the semiconductor device has been assembled because the line connecting to the fuse can be extended to a pad such that a fusing current can be directly supplied from outside or its supply can be indirectly controlled from outside. Depending on the nature of the switching means, the fuse may remain connected to the resistor except when the trimming is carried out. In this manner, a surge current which may flow into the fusing current supply line can be prevented from reaching the fuse and hence the fuse is well protected.

A plurality of such combinations of a resistor and trimming means may be connected in series to form a resistor network, a decoder being further provided for selecting one or more of the assemblies and causing a fusing current to flow only through the selected assemblies and breaking the fuses therein. The selection (of one or more fuses to be broken for fine adjustment) is made after the resistance of the semiconductor device is measured and compared with its target value and is communicated to the device from outside by way of an encoded signal. The decoder serves to decode the encoded signal which is received from outside and causes the fusing current to break the selected fuse (or fuses). Although pads must be provided for accessing the fuses from outside, only the number of pads required to transmit necessary accessing data to the decoder need to be provided, not the total number of the fuses. Thus, the number of pads for accessing the fuses is significantly reduced according to this invention. If an IC pin is to be connected to each pad, the number of required IC pins is also significantly reduced.

A source of the aforementioned fusing current may be also contained as a part of the semiconductor device. Such a current source can additionally serve to attenuate a surge current, which may invade from outside, before it reaches the fuse.

The aforementioned decoder may further serve to control the fusing current (or its source) such that no current is allowed to pass through except when it is intended to break a specified fuse or fuses.

According to a preferred embodiment of the invention, the plurality of resistors in the resistor network form a voltage divider adapted to output a divided voltage. Since the divided voltage from such a voltage divider changes according to the ratio of the resistance values of two parts of the resistor network which can both be fine-adjusted, the divided voltage can be either increased or decreased although fuses cannot be reconnected once they are broken.

The invention also relates to a system including a plurality of voltage detecting circuits each having a voltage divider but using a common source of a reference voltage to compare its divided voltage therewith. In other words, each of the plurality of voltage detecting circuits serves to compare the voltage detected by its own voltage divider and a same reference voltage, or to calculate their difference. Since these voltage detecting circuits are adjusted not by varying the reference voltage but by individually trimming and since the trimming of these voltage dividers need not be done simultaneously, only one decoder is required for the purpose and hence the number of required pads can be significantly reduced. Since only one circuit for generating the common reference voltage is required, the system according to this invention can be realized with a simpler circuitry.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIG. 1 is a block diagram of a semiconductor device according to a first embodiment of this invention;

FIG. 2 is a block diagram of a semiconductor device according to a second embodiment of this invention;

FIG. 3 is a block diagram of a semiconductor device according to a third embodiment of this invention;

FIG. 4 is a block diagram of a semiconductor device according to a fourth embodiment of this invention;

FIG. 5 is a block diagram of a semiconductor device according to a fifth embodiment of this invention;

FIG. 6 is a block diagram of a semiconductor device according to a sixth embodiment of this invention;

FIG. 7 is a block diagram of a semiconductor device according to a seventh embodiment of this invention;

FIG. 8 is a block diagram of a prior art semiconductor device; and

FIG. 9 is a block diagram of another prior art semiconductor device.

DETAILED DESCRIPTION OF THE INVENTION

The invention is described next by way of several examples with reference to the drawings.

FIG. 1 shows a semiconductor device (IC) 10 according to a first embodiment of this invention, which is similar to the prior art device 1a shown in FIG. 9 but different therefrom in that switch circuits 15, 16 and 17 and another set of switch circuits 15a, 16a and 17a are inserted on both ends respectively of the fuses 5, 6 and 7 which are connected respectively in parallel to the three resistor units Ra, Rb and Rc and that a decoder 13, a register 14 and a serial-to-parallel (S/P) converter 14a are additionally provided. (The expression "resistor units" is herein used to indicate that they need not each consist of a single resistor but may be a combination of resistance-providing elements together having a specified resistance value.) In FIG. 1, numeral 11 indicates a resistor network, including a series connection of resistor units Ra, Rb, Rc and Rd each of resistance (indicated by the same symbol) in the range of several k$\Omega$ to several M$\Omega$, extended between terminals A and B and intended to together have a specified resistance value therebetween. The resistance of these fuses 5, 6 and 7 in the short-circuit (or closed) condition is negligibly small, being only about 20$\Omega$, and a current of about 15–20 mA will break these fuses.

The switch circuit 15 is formed with a suitable analog switch or a bipolar transistor so as to be appropriate for the semiconductor production process suited for the other circuits of the device, having three ("first", "second" and "third") terminals such that the first terminal is in a conductive relationship selectively either with the second or third terminal, depending on a received control signal. In the resistor network 11, the first terminal is connected to one end of the fuse 5, the second terminal is connected to one end of the resistor unit Ra and the third terminal is connected to a fusing current supply line C. The switch circuit 15a, which forms a pair with the switch circuit 15, is similarly structured and its first, second and third terminals are connected respectively to the other end of the fuse 5, the other end of the resistor unit Ra and a fusing current return line D which forms a pair with the aforementioned fusing current supply line C. Thus, the switch circuit 15, together with the other switch circuit 15a, may be said to serve as a switching means for connecting the fuse 5 selectively either to the resistor unit Ra of the resistor network 11 or the fusing current supply line C.

Similarly, switch circuits 16 and 16a are provided with respect to resistor unit Rb and fuse 6, and switch circuits 17 and 17a are provided with respect to resistor unit Rc and fuse 7. Thus, the resistor network 11 may be simply described as having a plurality of combinations of a fuse and a switching means (5+15, 6+16 and 7+17). Since the fusing current supply line C is connected in common to all these combinations, there is only one pad 12, instead of the many pads 5a, 6a and 7a of the prior art IC 1a shown in FIG. 9. Similarly, since the fusing current return line D is also connected in common to all these combinations, there is also one pad 12a, instead of the many pads 5b, 6b and 7b of the prior art IC 1a.

The decoder 13 has three output (decode) lines E, F and G and is adapted to receive 2-bit digital data signals from the register 14, making none of the output lines E, F and G significant if the input signal is "0", only the output line E if the input signal is "1", only the output line F if the input signal is "2" and only the output line G if the input signal is "3". These output lines E, F and G serve to control respectively the pairs of the switch circuits 15+15a, 16+16a and 17+17a. Thus, the decoder 13 serves to select one of these pairs of a fuse and a switching means (5+15, 6+16 and 7+17) through its decode lines E, F and G to connect the selected pair to the fusing current supply line C and also to connect the switch circuit 15a, 16a or 17a associated with the selected pair to the fusing current return line D.

The register 14, connected to the decoder 13, serves to store 2-bit parallel data. The S/P converter 14a is inserted between a pad 14b and the register 14 such that trimming data which are transmitted in parallel through this pad 14b (say, from a trimming jig 18 shown also in FIG. 1) can be transmitted to the decoder 13 after they are parallel-converted in synchronism with a clock signal CLK received through another pad 14c.

The trimming jig 18 is a device separate from the IC 10, comprising a constant current source 18a for supplying a fusing current, a parallel-to-serial (P/S) converter 18c for receiving trimming data (say, from a microprocessor 18b) and to carry out a P/S conversion corresponding to the S/P conversion by the S/P converter 14a, a clock generator for generating the aforementioned clock signal CLK according to which the trimming data are transmitted, and a grounding terminal GND connected to the fusing current return line. Although not shown, it is also provided with a suitable connector such as an IC socket or an IC clip such that the contact resistance will be stable even by a dynamic connection when the IC 10 is accessed after it is completed.

The fine adjustment of the IC 10 for its resistance may be carried out in a conventional manner while it is in the state of a wafer but a trimming process which may be carried out after its assembly will be described next.

The resistance value between the terminals A and B is measured first. Since the fuses 5, 6 and 7 are connected in parallel to the resistor units Ra, Rb and Rc at this moment, what is measured is substantially the resistance of the resistor Rd alone. If this measured resistance value is within a specified range, the IC 10 needs no trimming. If the measured value is not within this allowable range, it must be decided which of the resistor units Ra, Rb and Rc must be "added". Let us assume that it has been decided that the resistor unit Rb must be added in order to bring the resultant resistance into the allowable range. In this case, the corresponding trimming data signal is "2".

Next, the trimming jig 18 is connected to the IC 10. If the static charge on the person of the user is discharged to the IC 10 at this moment, the current from the pad 12 to the fusing current supply line C will stop at the positions of the switch circuits 15, 16 and 17, and similarly for the discharge from the pad 12a to the fusing current return line D. The discharge through the pads 14b and 14c are stopped by the register 14 and the S/P converter 14a. Thus, the fuses 5, 6 and 7 are safely protected because none of these discharge currents will reach them.

With the connection thus established between the IC 10 and the trimming jig 18, a fusing current can now be introduced from the constant current source 18a through the pad 12 to the fusing current supply line C and returned through the fusing current return line D and the pad 12a to the grounding terminal GND. A clock signal CLK is transmitted to the register 14 and the S/P converter 14a through the pad 14c such that the trimming data are now ready to be serially transmitted through the pad 14b. As the trimming jig 18 is then operated to cause the value "2" to be outputted from the microprocessor 18b to the P/S converter 18c, a start bit and a stop bit are attached in a known manner to the front and the back of this signal to form a bit row "1100", for example, to be transmitted from the P/S converter 18c to the S/P converter 14a. The value "2", now returned as parallel data, is then loaded in the register 14 and transmitted further to the decoder 13. The decoder 13 responds by making the decode line F significant, switching the corresponding switch circuits 16 and 16a such that a fusing current flows through the fusing current supply line C, the switch circuit 16, the fuse 6, the other switch circuit 16a and the fusing current return line D. Thus, the specified fuse 6 is disconnected and the total resistance of the resistor network 11 between the terminals A and B changes from the resistance of the resistor unit Rd alone to that of the resistor units Rb and Rd.

The fuse 5 and/or the fuse 7 can also be selected, depending on the result of the initial measurement of the resistance of the resistor network 11. In summary, the IC 10 thus structured is advantageous over the prior art IC 1a in that the number of pads can be reduced because the fuses 5, 6 and 7 are not only protected against static discharges but also adapted to be selectively cut.

FIG. 2 shows another IC 20 according to a second embodiment of this invention, which is different from the IC 10 of the first embodiment only in that there is a constant current source 22 contained therein and a decoder 23 adapted to receive trimming data in parallel. The constant current source 22 is similar to the one in the first embodiment of the invention (shown at 18a in FIG. 1) but is provided within the IC 20 instead of inside the trimming jig 18 and is connected to a power line $V_{CC}$ in common with other internal circuits and to the fusing current supply line C. The decoder 23 is also similar to the decoder 13 shown in FIG. 1 but not only has input lines connected to pads 23a and 23b but also is adapted to make a decode output only when an enabling pulse is received through a third pad 23c such that trimming data can be received directly in parallel and not through the likes of the register 14 or the S/P converter 14a of FIG. 1. Numeral 28 indicates a trimming jig for use with this IC 20, containing a register 28c adapted not only to receive a trimming data signal (say, from a microprocessor 28b) and to store it but also to output it in parallel.

After the IC 20 is connected to the trimming jig 28 and a trimming data signal is caused to be outputted from the microprocessor 28b to the register 28c by operating on the trimming jig 28, this data signal is transmitted through the pads 23a and 23b to the decoder 23 in parallel. During this transmission, an enabling pulse is also outputted from the microprocessor and as this pulse is transmitted to the decoder 23 through the pad 23c, the decoder 23 responds by making one (or more) of its decode lines E, F and G significant, causing a fusing current to flow through the corresponding one (or more) of the combinations 5+15, 6+16 and 7+17 of a switching circuit and a fuse and thereby breaking the specified fuse (or fuses) to adjust the total resistance R1 of the resistor network 11 (only schematically shown in FIG. 2).

If a surge current passes through the power line $V_{CC}$ inside the IC 20 during this process, it is weakened by the constant current source 22 before reaching the fusing current supply line C. Since there is no other current that may directly reach the fusing current supply line C, the fuses 5, 6 and 7 are well protected in this example, too.

FIG. 3 shows still another IC 30 according to a third embodiment of the invention, which is different from the IC 20 described above only with respect to its constant current source 32 and decoder 33.

The constant current source 32 in this example is characterized as being adapted to output a current only while an enabling pulse is being received. The decoder 33 in this example is characterized as being adapted to transmit the enabling pulse to the constant current source 32 only after the output to the decode line has been stabilized. The width of the enabling pulse is selected to be large enough for breaking a fuse but otherwise as short as possible such that the operating time of the constant current source 32 can be minimized by the decoder 33. The decoder 33 is therefore also referred to as "the current limiting means". In this manner, the current from the power line $V_{CC}$ to the fusing current supply line C is shut off by the constant current source 32 except when a fusing current is being passed to the fusing current supply line C. Thus, the fuses 5, 6 and 7 are again well protected from a surge current which may flow through the power line $V_{CC}$.

FIG. 4 shows a constant voltage regulator (IC) 40 as an example of semiconductor device according to a fourth embodiment of this invention. This IC 40 is different from the IC 10 described above in that the resistor network 11 is divided into two parts forming a pair together inside a constant voltage regulator part 49 and that its decoder 43, register 44 and S/P converter 44a are different from the corresponding components of the IC 10.

One of the pair of resistor networks 11 ("the first network") has its terminal A connected to a line leading to a pad 47 for outputting a current $I_O$ to an external load and its terminal B connected to the terminal A of the other resistor network 11 ("the second network"). The terminal B of the second resistor network 11 is grounded. Thus, this combination is an equivalent of a series connection of a resistor with resistance $R_1$ (the resistance of the first network) and another resistor with resistance $R_2$ (the resistance of the second network) such that, if $V_0$ is the voltage at the pad 47, a divided voltage $V_d = V_0 R_2/(R_1 + R_2)$ appears at a junction between the two resistor networks 11. Thus, this pair of resistor networks 11 may be considered as forming a voltage divider of a sort.

The decoder 43 has six output (decode) lines and is adapted to receive 3-bit digital data signals in order to serve both of the pair of resistor networks 11, and both the register 44 and the S/P converter 44a serve to handle 3-bit data. As a trimming data signal is received through a pad 44b, one (or more) of the fuses of either (or both) of the resistor networks 11 is (or are) thereby selected and broken selectively so as to fine-adjust either (or both) of the resistance values $R_1$ and $R_2$.

The constant voltage regulator part 49 further includes an operational amplifier 45 for receiving a reference voltage $V_{ref}$ through its non-inversion terminal and the divided voltage $V_d$ through its inversion terminal to thereby amplify and output their difference and a power transistor 46 for controlling the current flowing from the power line $V_{CC}$ to the pad 47 according to the output from this operational amplifier 45. Thus structured, the constant voltage regulator part 49 serves as a voltage detector for carrying out a differential amplification on the basis of the divided voltage $V_d$ detected by a voltage divider and a common reference voltage $V_{ref}$. The power transistor 46 may comprise a MOS transistor or a bipolar transistor of either PNP or NPN type.

The output voltage $V_O$ to the load is kept at a constant value given by $V_{ref}(1+R_1/R_2)$. Since this is uniquely determined by the ratio of the resistance values $R_1$ and $R_2$, the trimming is carried out such that their ratio will satisfy a required condition. When this constant voltage regulator 40 is used for stabilizing the power source of an MPU of which the load current $I_O$ fluctuates within a range of about 30 mA–200 mA, for example, the trimming will be carried out on the resistor network 11 with resistance $R_1$ if the value $(1+R_1/R_2)$ must be increased. If the fine adjustment must be carried out so as to decrease the value of $(1+R_1/R_2)$, on the other hand, the trimming is carried out on the resistor network 11 with resistance $R_2$ so as to increase the value of $R_2$. Under certain circumstances, the trimming may be carried out on both such that the variation in the ratio $R_1/R_2$ will come to be less than 1.5%–2%. In the case of variations caused during the production of ICs, it is more common that both the resistance values $R_1$ and $R_2$ of the resistor networks within a same IC are too large or too small. In such a situation, it is easier to adjust the ratio of these two resistance values than the individual resistance values.

FIG. 5 shows another constant voltage regulator (IC) 50 as an example of semiconductor device according to a fifth embodiment of this invention. This IC 50 is different from the IC 40 according to the fourth embodiment of the invention described above only in that it has a differently structured constant voltage regulator part 59. The decoder 43, the register 44 and the S/P converter 44a are the same.

This constant voltage regulator part 59 also has a pair of resistor networks 11 (with resistance values again indicated by symbols $R_1$ and $R_2$) but this pair is between an input voltage line $V_{in}$ and the ground. The divided voltage $V_d$ which is generated between this pair of resistor networks 11 is given by $V_{in}R_2/(R_1+R_2)$. The constant voltage regulator part 59 further includes a comparator 55 (or "the comparing means") for receiving a reference voltage $V_{ref}$ through one of its input terminals and the divided voltage $V_d$ through the other of its input terminals and a switching transistor 56 which is inserted between a pad 57 and a grounding line and serves to switch on and off according to the output from the comparator 55. Thus structured, the constant voltage regulator part 59 serves as a voltage detector for carrying out a comparison on the basis of the divided voltage $V_d$ detected by a voltage divider and a common reference voltage $V_{ref}$.

With this embodiment, too, the ratio of the resistance values $R_1$ and $R_2$ is adjusted by trimming the pair of resistor networks 11, and the output through the pad 57 is switched when the input voltage $V_{in}$ crosses a specified value.

FIG. 6 shows a DC-DC converter (IC) 60 as an example of semiconductor device according to a sixth embodiment of this invention. This IC 60 is different from the constant voltage regulator IC 40 described above in that it comprises a DC-DC converter part 69 in the place of the constant voltage regulator part 49 of FIG. 4. The decoder 43, the register 44 and the S/P converter 44a are the same.

This DC-DC converter part 69 also has a pair of resistor networks 11 (with resistance values again indicated by symbols $R_1$ and $R_2$) but this pair is between a line to a pad 68b serving as an output terminal for voltage $V_O$ and the ground. The divided voltage $V_d$ which is generated between this pair of resistor networks 11 is given by $V_0R_2/(R_1+R_2)$. The DC-DC converter part 69 further includes a comparator 65 (or "the comparing means") for receiving a reference voltage $V_{ref}$ through one of its input terminals and the divided voltage $V_d$ through the other of its input terminals, an oscillator which oscillates intermittently according to the output from the comparator 65, an amplifier 66a for amplifying this oscillation signal to output it to the exterior through a pad 67 and a diode 68 with its anode and cathode respectively connected to pads 68a and 68b. Thus structured, this DC-DC converter part 69 also serves as a voltage detector for carrying out a comparison on the basis of the divided voltage $V_d$ detected by a voltage divider and a common reference voltage $V_{ref}$. In this application, a power source and a coil for transmitting an inertial current to the diode 68 through the pad 68a, a switching transistor for shunting this inertial current according to the oscillation output from the oscillator 66 and a capacitor for smoothing the output from the pad 68*a* rectified by the diode 68 may be attached externally. The ratio of $R_1$ to $R_2$ is adjusted as before by trimming the pair of resistor networks 11 such that the output voltage $V_O$ through the pad 68*a* will be reliably within a specified range.

FIG. 7 shows a system (IC) 70 as an example of semiconductor device according to a seventh embodiment of this invention. This system IC 70 contains within itself six constant voltage regulator parts (Reg1–Reg6) as indicated by numeral 49 and described above, as well as a voltage detecting part and a DC-DC converter part as indicated by numerals 59 and 69 respectively above. It also includes a voltage generating circuit 71 such as a band-gap constant voltage source for generating a reference voltage $V_{ref}$ and applying to all these parts 49, 59 and 69. In other words, this system 70 includes a plurality of voltage detection circuits for carrying out operations on the basis of a voltage detected by a voltage divider and a common reference voltage.

There is a decoder 73 having 48 output (decode) lines and being adapted to receive 6-bit digital data signals in order to serve all pairs of the resistor networks in the circuits 49, 59 and 69. There is also a register 44 and a S/P converter 74*a* serving to handle 6-bit data. When a trimming data signal is received through a pad 74*b*, a corresponding one (or more) of the fuses in the total of 16 resistor networks is (or are) selectively broken such that the voltage divider in each of the parts 49, 59 and 69 can be adjusted either upward or downward. It is to be noted in this connection that the trimming of as many as 48 fuses in this system 70 can be carried out by merely adding trimming pads having the same resistance as those pads added for the three fuses of the aforementioned IC 10.

Although the invention has been described above for cases wherein each resistor network includes three fuses to be trimmed but this is not intended to limit the scope of the invention. The number of fuses in each resistor network may be appropriately varied and determined, depending on the required level of accuracy and the variations resulting from the production process.

Semiconductor devices according to this invention enjoy many advantages. Firstly, the fuses to be trimmed are not damaged easily because they do not come into any contact with the exterior except at the time of a fine adjustment. Secondly, since the selection of the target fuse (or fuses) to be trimmed is carried out by encoding, the number of pads for the trimming can be reduced significantly. Thirdly, the surge current is prevented from damaging the fuses. Fourthly, the trimming can be done easily and effectively because the divided voltage can be either increased or decreased by simply breaking a fuse. Fifthly, the number of pads is even more reduced and the scale of the circuit can also be reduced because a common reference voltage is used and each voltage divider circuit can be individually trimmed.

What is claimed is:

1. A semiconductor device comprising:
 a resistor;
 a fusing current supply line; and
 a trimming means for fine-adjusting resistance of said semiconductor device, said trimming means including a fuse and switching means for selectively connecting said fuse in parallel with said resistor or to said fusing current supply line, said fusing current supply line serving to break said fuse by passing a fusing current therethrough.

2. The semiconductor device of claim 1 wherein said resistor is one of a plurality of resistors connected in series, said trimming means is one of a plurality of trimming means each associated with a corresponding one of said resistors, and said semiconductor device further comprises a decoder for causing said fusing current to pass through a selected one or more of the fuses.

3. The semiconductor device of claim 1 containing a current source for supplying said fusing current through said fusing current supply line.

4. The semiconductor device of claim 2 containing a current source for supplying said fusing current through said fusing current supply line.

5. The semiconductor device of claim 3 further comprising a current limiting means for transmitting an enabling pulse, said fusing current being outputted only while said enabling pulse is being received by said current source.

6. The semiconductor device of claim 4 wherein said decoder serves to transmit an enabling pulse, said fusing current being outputted only while said enabling pulse is being received by said current source.

7. The semiconductor device of claim 1 wherein said resistor is one of a plurality of resistors connected in series, said trimming means is one of a plurality of trimming means each associated with a corresponding one of said resistors, and said plurality of resistors connected in series form a voltage divider serving to output a divided voltage.

8. The semiconductor device of claim 2 wherein said plurality of resistors connected in series form a voltage divider serving to output a divided voltage.

9. The semiconductor device of claim 3 wherein said plurality of resistors connected in series form a voltage divider serving to output a divided voltage.

10. The semiconductor device of claim 4 wherein said plurality of resistors connected in series form a voltage divider serving to output a divided voltage.

11. The semiconductor device of claim 5 wherein said plurality of resistors connected in series form a voltage divider serving to output a divided voltage.

12. The semiconductor device of claim 6 wherein said plurality of resistors connected in series form a voltage divider serving to output a divided voltage.

13. The semiconductor device of claim 7 further comprising a plurality of voltage detectors each of which received a common reference voltage and compares said common reference voltage with said divided voltage.

14. The semiconductor device of claim 8 further comprising a plurality of voltage detectors each of which received a common reference voltage and compares said common reference voltage with said divided voltage.

15. The semiconductor device of claim 9 further comprising a plurality of voltage detectors each of which received a common reference voltage and compares said common reference voltage with said divided voltage.

16. The semiconductor device of claim 10 further comprising a plurality of voltage detectors each of which received a common reference voltage and compares said common reference voltage with said divided voltage.

17. The semiconductor device of claim 11 further comprising a plurality of voltage detectors each of which received a common reference voltage and compares said common reference voltage with said divided voltage.

18. The semiconductor device of claim 12 further comprising a plurality of voltage detectors each of which received a common reference voltage and compares said common reference voltage with said divided voltage.

* * * * *